United States Patent [19]

Shimamura

[11] Patent Number: 4,483,749

[45] Date of Patent: Nov. 20, 1984

[54] METHOD AND APPARATUS FOR PLATING MINUTE PARTS

[75] Inventor: Koichi Shimamura, Yokohama, Japan

[73] Assignee: Sonix Ltd., Kanagawa, Japan

[21] Appl. No.: 508,659

[22] Filed: Jun. 28, 1983

[30] Foreign Application Priority Data

Aug. 10, 1981 [JP] Japan .................. 56-125783

[51] Int. Cl.³ .............. C25D 5/02; C25D 5/08; C25D 17/00
[52] U.S. Cl. ................... 204/15; 204/224 R; 204/DIG. 7
[58] Field of Search ............... 204/15, DIG. 7, 224 R, 204/297 M

[56] References Cited

U.S. PATENT DOCUMENTS 2,987,460  6/1961  Mizia ..................... 204/297 M
3,536,594  10/1970  Pritchard ................. 204/297 M
4,287,029  9/1981  Shimamura ................ 204/15
4,348,267  9/1982  Shimamura ................ 204/206

FOREIGN PATENT DOCUMENTS 56-102590  8/1981  Japan .

Primary Examiner—Thomas Tufariello
Attorney, Agent, or Firm—Armstrong, Nikaido, Marmelstein & Kubovcik

[57] ABSTRACT

Here are disclosed a method and apparatus for making it possible to plate specific parts of members to be plated to be high in the precision and quality even in minute area parts.

In highly integrated printed base plates and integrated circuit elements, it has been difficult to plate precious metals high in the specific conductivity precisely and uniformly in the required minute parts with a plating apparatus in order to control as much as possible the resistances and impedances in the respective terminals and contacts. Therefore, according to the present invention, in a jetting type plating apparatus jetting a plating liquid through a nozzle onto a specific part required to be plated of an object to be plated, a mask is brought into close contact with the periphery of the specific part opposed to the nozzle to form a sealed space around the nozzle by a closely enclosing means, the object to be plated is set at a distance adjacent to the nozzle tip, a voltage of a predetermined polarity is impressed to make the migration of metal ions by an electric field conspicuous, to make a plating treatment possible and the sealed space is held under a negative pressure to quickly suck and discharge the used plating liquid.

6 Claims, 4 Drawing Figures

METHOD AND APPARATUS FOR PLATING MINUTE PARTS

BACKGROUND OF THE INVENTION

This invention relates to a method and apparatus for plating minute parts whereby a plated layer of a precise and uniform thickness can be formed even in a minute area part of a specific part of a member to be plated.

Nowadays, a partial plating of only a specific part of a member to be plated is considered to be important in respect of its function and resource saving and is indispensable particularly to the electronic industrial field.

As well known, in integrated circuit elements, various semiconductor elements, printed base plate fitting minute electronic parts, displaying elements and highly integrated printed base plates, it is important to inhibit as much as possible resistances and reactances at the respective terminals, contacts and electrode points and to control unnecessary voltage drops, electric power losses, noise generations, circuit time constant variations and influences on other circuits.

Therefore, in the above mentioned respective electronic parts and printed base plates, it is necessary to use such metal high in the conductivity and anticorrosion as such precious metal as, for example, gold Au, platinum Pt, silver Ag or rhodium Rh. However, these metals are materials so costly as to be applied by a jetting type partial plating means which can plate only really necessary parts and uses a slight amount of the plating mother material. In the partial plating means in the prior art example, a plating liquid jetting nozzle and a mask enclosing a specific part of a member to be plated are provided and the plating liquid jetting nozzle and the member to be plated are made electrodes.

The flow of the metal ions in the plating liquid is a sum of a migration by the electric field, a diffusion by the concentration variation near the electrode and a convection movement proportional to the flow velocity of the plating liquid but the concentration variation particularly near the electrode will inhibit the reaction velocity and reduce the current efficiency.

Therefore, the above mentioned prior art example has such defects as are described below:

(1) After the plating liquid collides with the surface to be plated, it is so difficult to control the flow velocity that the area wet with the plating liquid will expand to be larger than the opening area of the mask and it will be difficult to accurately plate only the really required minute area part.

(2) The feed of the metal ions in the plating liquid is so low as to be of a low current density of about 20 to 30 A./dm$^2$. that the plating time will be long and the current fluctuation during the plating will be so large that the plated thickness will be likely to become nonuniform.

(3) Even if the member to be plated is plated while masked correspondingly to its form, the flow volume of the plating liquid will be difficult to control, the adjustment of the distance between the nozzle and the member to be plated will be limited, therefore an inaccurate definition will be likely to occur, the plating specks will be produced, the plating boundary will become unclear and the plating mother material will be consumed more than is necessary.

(4) In the case of changing the mask in response to the kind of the member to be plated, not only the mask exchanging work but also the adjustment of setting the nozzle and mask will be difficult, a so-called preparation time will be taken, the workability will be low and therefore it will not be adapted to a small production of many kinds.

(5) In the case of continuously partly plating such long members to be plated as hoop members, the nozzle masking system as well as the plating liquid feed controlling system will be made a multi-system. However, in the multi-system, the distance between the member to be plated and the nozzle, the flow volume and velocity of the plating liquid and the volumes of the sucked and exhausted gases will be likely to fluctuate and they will be so difficult to adjust that the quality of the plating of the plated products will be so difficult to control as to be a great obstacle to the mass production.

(6) As mentioned above, the plating time is so long that the entire plating apparatus will become large, the control system will be complicated, therefore the equipment cost will be high, the occupied setting area will become large, the maintenance will be difficult and, in the case of newly providing, increasing, improving or moving the equipment, a great problem will come out.

(7) As the rate of yield will reduce due to the fluctuation of the quality of the plating and, as the step and quality controlling workers, many steps, excess jigs and examining equipments are required, the running cost as well as the equipment cost will be high.

On the other hand, as the current passing capacity in the above mentioned electronic part is usually about several $\mu$A. to several $+$mA., for example, the precious metal plating of the contact part will be enough with a diameter of less than 1 mm. and a thickness of several $\mu$. Also, as in the lead frame of the integrated circuit (IC) element, when many conducting parts of a minute width are arranged very adjacently, it will be enough to plate the terminal with gold of a diameter of about 0.2 mm. and a thickness of about 1$\mu$.

Thus, the plating of a minute amount will do but, in the partial plating means of the prior art example, as there are such problems as are mentioned above, the consumption of the costly precious metal will be more than is necessary, the plating quality and precision will be low and, as the mass productivity is none, the mass production of cheap products will be greatly obstructed.

In view of such problems as in the above, "A method and apparatus for plating minute areas" are suggested in Japanese Patent Application No. 100772/1979. "A plating process" by U.S. Pat. No. 4,287,029 and "A plating means" by U.S. Pat. No. 4,348,267 are suggested.

That is to say, in plating a part to be plated by jetting a plating liquid onto the part through a tapered through hole formed in a mask opposed to a nozzle, outside air or a compressed gas is made to flow in through an air passage formed in the mask so as to communicate with the above mentioned through hole in the direction substantially at right angles with the direction of the nozzle so that the jetted plating liquid will be quickly prevented by the gas flowing in from staying in the through hole part, the current density will be elevated and the used plating liquid jetted onto the part to be plated will be sucked by a sucking device through a discharging pipe in the rear of the nozzle, the chamber including the nozzle will be under a negative pressure and thereby the used plating liquid discharging velocity will be increased. Thus, the minute part can be plated to be high in the precision and quality.

However, in case the object to be plated is such as each lead tip of an integrated circuit lead frame, if the nozzle is made in a multi-system as described above, the entire structure will be so minute and the distance between the electrodes will be so close that there will be such problems as in the following.

There has been a problem that, in the case of forming the air passage in the mask, a high working precision will be required and the mask making and plating costs will be high.

Also, as the air passage communicating with the outside is formed in the mask so that outside air or a compressed gas may be introduced to the through hole side, the absolute value of the negative pressure within the chamber under the negative pressure in advance will become small and the distance between the nozzle and the object to be plated will be so small that, in case the above mentioned gas flows in or the plating liquid is jetted onto the part to be plated from the nozzle, it will be subjected to a resistance, the plating liquid jetting velocity will reduce and it will be necessary to pressurize the plating liquid tank or to elevate the static position potential.

BRIEF SUMMARY OF THE INVENTION

An object of the present invention is to provide a method and apparatus for plating minute parts wherein a plating liquid after being jetted onto a part to be plated is quickly discharged to elevate the plating velocity.

Another object of the present invention is to provide a minute part plating apparatus whereby a minute part can be precisely plated by preventing an inaccurate definition.

A further object of the present invention is to provide a minute part plating apparatus wherein a plating liquid can be continuously re-used.

Further, other objects, features and advantages of the present invention will become apparent enough with the following explanation.

BRIEF DESCRIPTION OF THE DRAWINGS

FIG. 2 is a sectioned view showing the peripheral part of a mask and nozzle system in the first embodiment.

FIG. 3 is a sectioned view showing a mask part as magnified.

DETAILED DESCRIPTION

Figure 1:
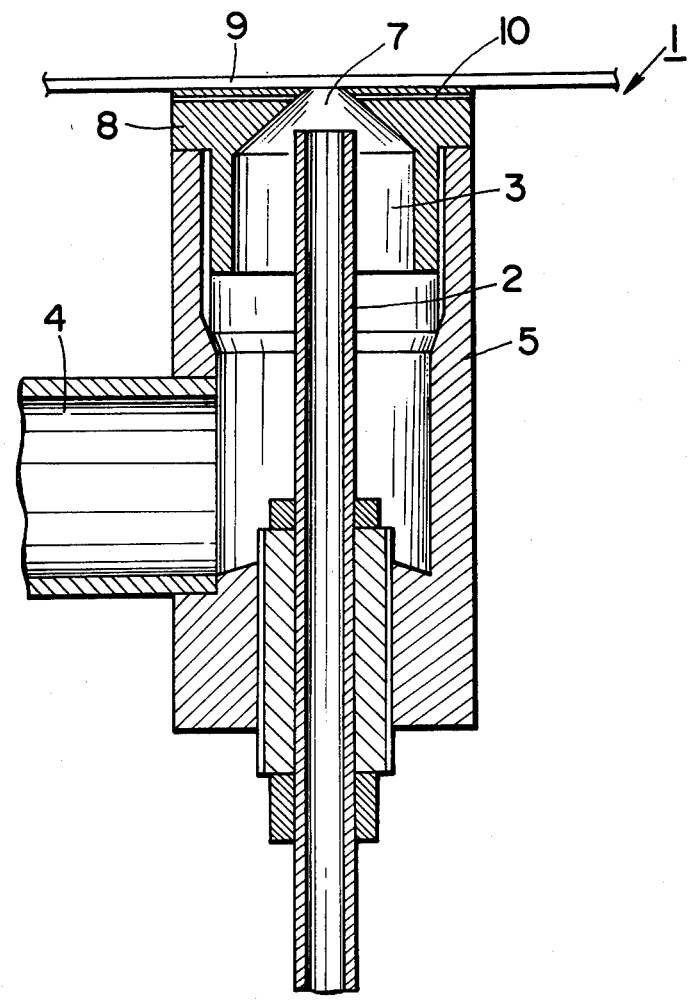
FIG. 1 is a sectioned view showing the peripheral part of a mask and nozzle system in a prior art example.

Prior to explaining the embodiments of the present invention, the conventional example of a minute part plating apparatus shall be explained with reference to FIG. 1.

In this minute part plating apparatus, a nozzle 2 for jetting a pressurized plating liquid is removably secured to a jacket tube 5 provided with a chamber 3 of a predetermined capacity and a discharging pipe 4 communicating with it.

Also, a mask 8 in which a through hole 7 facing the tip of the above mentioned nozzle 2 is formed is removably secured to the top of the above mentioned jacket tube 5 so that, in the case of a plating treatment, a member 9 to be plated will be arranged in contact with this mask 8 and, in the case of plating, the nozzle 2 will be connected to a + pole of a direct current source and the member 9 to be plated will be connected to a − pole of the same. Further, in the case of melting a metal or the like on the surface of the plated member 9, that is, in the case of reverse plating, the polarities of the direct current source may be reversed with each other. By the way, an air passage 10 communicating with outside air is formed in the mask 8 as to be connected with an outside piping (not illustrated) in case a compressed gas (air or an inert gas) is made to flow in.

Further, a discharging pipe 4 is connected with an exhaust pump (not illustrated). In the above described plating apparatus 1, in the case of the plating treatment, the exhaust pump will be driven to hold the chamber 3 and discharging pipe 4 under a negative pressure so that, when the direct current source is impressed, outside air or the compressed gas will be made to flow in through the air passage 10 and a plating liquid will be jetted from the nozzle 2. This plating liquid will collide with the member 9 to be plated through the mask 8 while in the form of a pillar of a thickness approximate to the inside diameter of the nozzle. At this time, a metal will be deposited on the member 9 to be plated and the part corresponding to the through hole 7 will be plated.

Also, the outside air or compressed gas flowing in through the air passage 10 will concentrate near the through hole 7 and will flow into the chamber 3, therefore the plating liquid will be prevented from being diffused, the concentration on the member to be plated will become high, the current density will also rise and therefore the plating quality will be improved and stabilized.

Further, as the discharging pipe 4 and chamber 3 are under the negative pressure and the outside air or compressed gas flows in through the air passage 10, the plating liquid jetted from the nozzle 2 will be quickly forcibly discharged after being used.

Therefore, the bonded surfaced of the mask 8 and the member 9 to be plated will be wet and will prevent the plating liquid from penetrating out and therefore an inaccurate definition will be able to be prevented.

Further, as a fresh liquid phase is always on the boundary of the member to be plated (a solid phase) and the plating liquid (a liquid phase), a diffused layer likely to be produced on this boundary will become so thin that the ion concentration will become uniform and, the same as forming an electrolyte pillar formed of only a specific electric resistance inherent to the plating liquid, the current value will become constant and stable, therefore the depositing velocity of the metal will be also stabilized and a high quality plating will be obtained.

However, in case the object to be plated is such as each lead tip of an integrated circuit lead frame, there will be the above described problems.

The present invention is to solve the above mentioned problems to make it possible to plate even minute parts to be high in the precision and quality.

In the following, the embodiments of the method and apparatus for plating minute parts according to the present invention shall be explained with reference to FIG. 2 and others following it.

Figure 2:
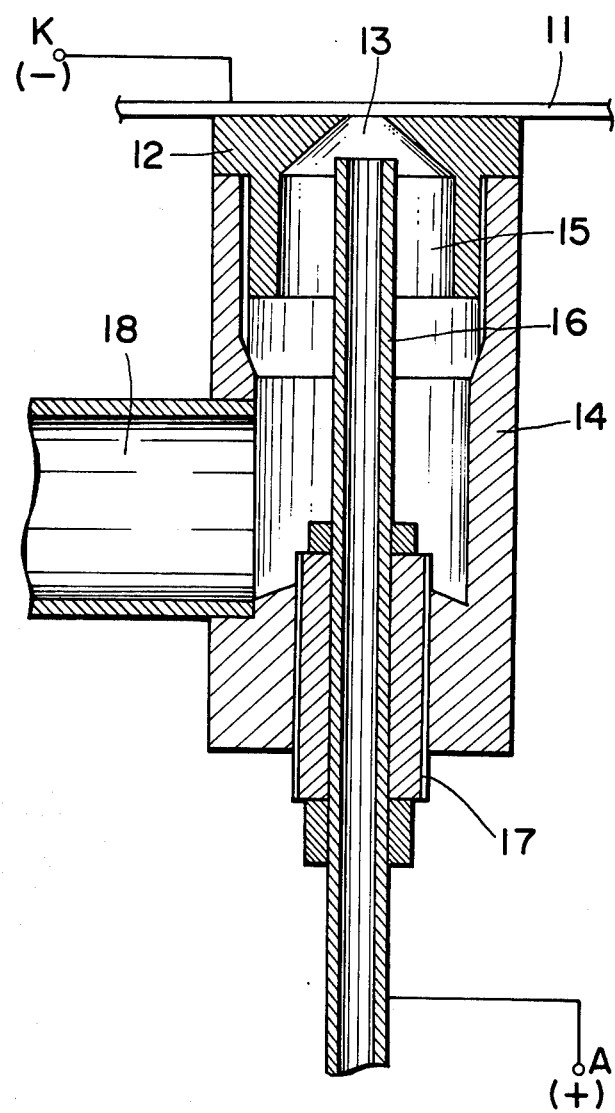
FIGS. 2 and 3 relate to the first embodiment of the present invention.
Figure 3:
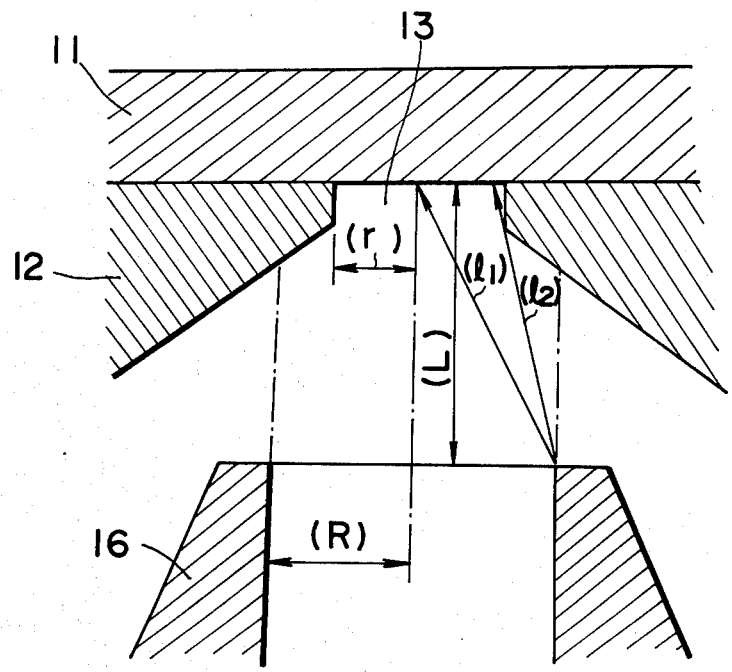

As shown in FIGS. 2 and 3, a through hole 13 tapered in the form corresponding to an object to be plated is made in a mask 12 closely fittable to an object 11 to be plated. This mask 12 is secured on the stem side to a jacket tube 14.

A chamber 15 of a predetermined capacity is formed in the jacket tube 14. A nozzle 16 opposed to the above mentioned through hole 13 and a nozzle holder 17 are arranged in the bottom of the chamber 15. The nozzle holder 17 is made free to rise and fall while holding the nozzle 16 so that the distance between the object 11 to be plated and the nozzle 16 (which distance shall be called an inter-electrode distance hereinafter) can be adjusted.

Any number of discharging pipes 18 for discharging the plating liquid as described later are passed through the side wall of the bottom of the jacket tube 14. This discharging pipe 18 is connected at the end to a sucking device (not illustrated) through a plating liquid separator (not illustrated) so that the discharging pipe 18 and chamber 15 may be set under a negative pressure of a predetermined value.

By the way, the above mentioned nozzle 16 is connected at the rear end to a plating liquid tank connected to the plating liquid separator so that a reproduced plating liquid may be added. Further, as required, for example, in case a back pressure is produced by the plating liquid near the nozzle 16 and the subsequent plating liquid pressure can not resist it, the position of setting this plating liquid tank will be elevated so that a pressure may be given to the plating liquid by the potential energy or a pump will be provided between the nozzle 16 and the plating liquid tank to pressurize the plating liquid or to set the plating liquid tank under a high pressure.

Also, the nozzle 16 is connected to the + pole of the direct current source so as to be on the anode side and the object 11 to be plated is connected to the − side so as to be on the cathode side.

There shall be explained in the following the operation of the method and apparatus of the first embodiment of the present invention wherein thus a specific part of the object 11 to be plated is enclosed with the mask 12 to form a plating treating part by the masking means, the mask 12 is brought into close contact with the object 11 to be plated to hold the chamber 15 within the jacket tube 14 in a sealed space, the plating liquid is jetted under a predetermined pressure from the nozzle 16 forming a plating liquid jetting means within the sealed space, the nozzle 16 is made an anode, the object 11 to be plated is made a cathode to plate the specific part of the object 11 to be plated and the sealed space is held under a negative pressure by the discharging means through the discharging pipes connected to the above mentioned sealed space so as to discharge the used plating liquid.

When the mask 12 is brought into close contact with a predetermined part of the object 11 to be plated, the interior of the mask 12 and jacket tube 14 will be a sealed space.

Under this state, the plating liquid is jetted onto the object 11 to be plated through the through hole 13 of the mask 12 from the nozzle 16 so as to deposit a metal. This used plating liquid is forcibly and quickly discharged through the discharging pipes 18 through the chamber 15 by the negative pressure. At this time, the metal will be deposited on the object 11 to be plated but the plating liquid will penetrate also to the contact surface of the mask 12 and the object 11 to be plated.

However, as well known, the flow velocity of the plating liquid jetted from the nozzle 16 will be fastest in the center part but will be slow in the peripheral part. However, if $0.5 < B/b \leq 3$ where B represents the area of the hole of the nozzle and b represents the area of the through hole of the mask, a fresh plating liquid will be always fed through the through hole 13 of the mask 12 and the thickness of the diffused layer will reduce and the metal will be effectively deposited, whereas, on the outer periphery of the through hole 13, the penetrating plating liquid will be a back pressure, no subsequent plating liquid will be fed and no optimum plating condition will be established.

As shown in FIG. 3, if the inside radius of the nozzle 16 is represented by R, the radius of the through hole 13 of the mask 12 is represented by r and the distance of the nozzle from the mask 12 is represented by L, the distance $l_1$ from the periphery of the nozzle 16 to the center of the object 11 to be plated will be $l_1 = \sqrt{L^2 + R^2}$.

On the other hand, the distance $l_2$ from the periphery of the nozzle 16 to the inside edge of the through hole 13 of the mask 12 will be $l_2 = \sqrt{L^2 + (R-r)^2}$ and, if the inter-electrode distance between the nozzle 16 and the object 11 to be plated is short, $l_1 \approx l_2$.

Therefore, within the range regulated by the through hole 13, the difference between the specific resistance values will be so small that the plating current density will be uniform but, on the contact surface of the mask 12 and the object 11 to be plated, the edge surface distance from the inside edge of the through hole 13 will increase, therefore the specific resistance will become larger than that of the center part and the plating current density will remarkably reduce. As a result, the metal will be deposited only on the part opposed to the through hole and a mesa-shaped plating having an accurate definition will be obtained.

On the other hand, if the inter-electrode distance is extremely contracted, the electric field intensity between both electrodes will become large. When a voltage of 1 V. is applied to a tank of an inter-electrode distance of 1 cm., the average velocity of ions moving toward the electrodes will be v/V.

A formula $v/V = \lambda/F$ (where $\lambda$ represents a value of an equivalent ionic conductance divided by 1 Faraday) well known as of an ionic mobility will be established. If a voltage of 100 V. is applied to an inter-electrode distance of 1 cm. by using the above formula, with silver ions, the mobility will be about 0.08 cm$^2$./sec. V. at the maximum (at a temperature of 75° C.). Usually the offshore ionic mobility can be neglected. However, as the value of the diffusing velocity D cm$^2$./sec. (varying with the temperature and concentration) produced from the concentration gradient is about 1 to $5 \times 10^{-5}$ cm$^2$./sec., even if the inter-electrode distance is about 0.1 to 2 mm. and the plating voltage is about 1.5 V., the electric field intensity will be 150 to 8 V./cm., the ionic mobility will be about 0.12 to 0.0064 cm$^2$./sec. and this value in the diffused layer near the cathode will be over the diffusing velocity.

As a result, the limiting current density in the diffusion rate determining process will be given by $i_{lim} = [(n \, F \, D \, C^b)/\delta]$ (where n represents an ionic value, F represents a Faraday constant, D represents a diffusion coefficient, $\delta$ represents a thickness of a diffused layer and $C^b$ represents an offshore concentration). However, D in the present invention will be the ionic mobility + diffusing velocity and a very large current density will be obtained.

In the case of the present invention, the velocity of the plating liquid on the cathode surface will be higher than in the case by the outside air introducing system shown in FIG. 1 and, even if the thickness of the diffused layer somewhat increases, D in the above mentioned formula will be able to be taken to be large enough to obtain a high current density.

On the other hand, in the part penetrated from the through hole of the mask, the distance along the surface from the anode will be large, the IR loss will increase, the plating potential will reduce to be a voltage extremely high in the depositing velocity or below the metal decomposing voltage and the metal will not be substantially deposited. Therefore, a plating having an accurate definition will be obtained.

As described above, in the present invention, the inter-electrode distance between the nozzle 16 and the object to be plated is so short and has such large relation with the current density distribution of the object to be plated as to be important to set. Therefore, in either a single plating device or a series of many plating devices, the inter-electrode distance may be finely adjusted with the nozzle holder 17.

Figure 4:
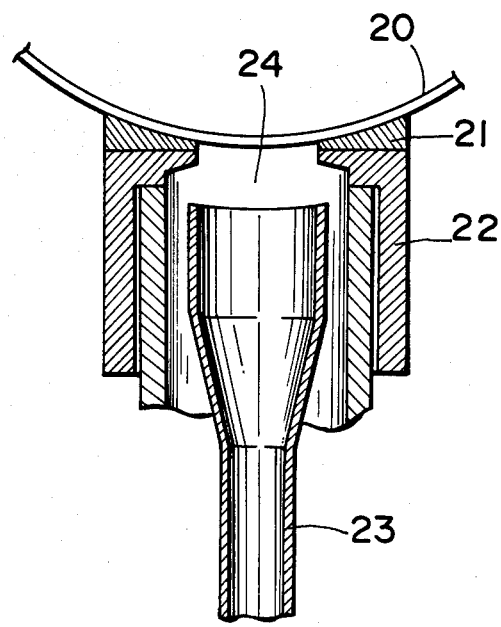
FIG. 4 is a sectioned view showing the peripheral part of a mask and nozzle system in the second embodiment of the present invention.

Further, in case the object to be plated has a curved surface, for example, in the case of such electric contacting piece (the object to be plated) 20 as is illustrated in FIG. 4, a curved mask body 21 to be in close contact with the curved surface as in the second embodiment shown in FIG. 4 is secured to a mask supporting member 22 and a communicating through hole 24 opposed to a nozzle 23 and having a diameter substantially equal to the inside diameter of the nozzle is made through the mask body 21 and mask supporting member 22.

The tip of the nozzle 23 is formed to be of a curved surface similar to the surface to be plated of the object 20 to be plated and the distance between each point of the opening edge of the nozzle and the surface to be plated is made constant.

Now, the plating liquid jetted from the nozzle 23 will contact the object 20 to be plated through the communicating through hole 24 of the mask body 21 and mask supporting member 22, will deposit a metal and then will be quickly discharged through the discharging pipes 18. Therefore, the same as in the first embodiment, a plating layer having a curved surface corresponding to the curvature and a uniform thickness will be produced on the object 20 to be plated.

In both of the above mentioned first and second embodiments, when sealed spaces are formed by bringing the mask 12 and mask body 21 into close contact respectively with the objects 11 and 20 bo be plated and are held under a negative pressure, a mesa-type minute part plating having an accurate definition will be obtained. What are important in the present invention are to make the respective inter-electrode distances respectively between the nozzles 16 and 23 and the objects 11 and 20 to be plated very short, to positively utilize the migration by the electric field and to elevate the flow velocity of the plating liquid.

Therefore, as mentioned above, it is very important to set the inter-electrode distance. If the inter-electrode distance is short, the used plating liquid discharging velocity will be necessarily a problem. In the present invention, the value of the negative pressure within the chamber can be properly set in response to the kind or form of the plating liquid, dimension, single plating treatment or series of many simultaneous plating treatments.

Needless to say, the minute part plating apparatus according to the present invention can be utilized for the minute area plating apparatus according to the above mentioned prior art example (Japanese Patent Application No. 100772/1979) and concretely, when it is to replace the mask-nozzle system, it will be very useful.

As described above, according to the present invention, the mask is brought into close contact with the object to be plated to form a sealed space and the inter-electrode distance between the nozzle and the object to be plated is made short to positively accelerate the electric field migration and to forcebly discharge under a negative pressure the used plating liquid after being jetted from the nozzle to plate the object so that there may be remarkable effects that the (absolute value of the) negative pressure value can be made large by the discharging means utilizing outside air, the velocity of the plating liquid can be made high, the plating efficiency by the increase of the current density can be made very high by the effect of the ionic mobility by the above described electric field intensity, it may not be necessary to provide an air passage which must be worked at a high precision in the mask and not only the mask manufacturing cost but also the plating cost will be low.

Also, in the method formed in the apparatus of each of the above described embodiments wherein the inter-electrode distance between the nozzle 16 or 23 and the object 11 or 20 to be plated is made short enough to be adjustable and is therefore set and adjusted as required, the plating liquid is jetted, the used plating liquid is forcibly discharged by holding the rear of the nozzle under a negative pressure and therefore the plating velocity can be made high.

By the way, it is apparent that working modes different in a wide range can be formed without deviating from the spirit and scope of the present invention. The present invention is not restricted by its specific working mode except being limited in the appended claims.

I claim:

1. A minute part plating method wherein a plating liquid is jetted from a nozzle onto a specific part to be plated of an object to be plated, characterized by comprising a masking means for enclosing the specific part of the object to be plated and setting a plating part, a discharging means for bringing the mask into close contact with the object to be plated to form a sealed space, holding this sealed space under a negative pressure of a predetermined value and discharging the used plating liquid, a plating liquid jetting means for jetting the plating liquid under a predetermined pressure from a nozzle arranged as opposed to the mask within the above mentioned sealed space and a means for making the nozzle an anode and the object to be plated a cathode and setting or adjusting a short distance between the electrodes the distance between electrodes being adjustable from about 0.1 to 2 mm by adjusting the nozzle holder making the nozzle free to rise and fall.

2. A minute part plating method according to claim 1, characterized in that said discharging means makes the negative pressure value in the above mentioned sealed space variable and controllable.

3. A minute part plating apparatus wherein a specific part to be plated of an object to be plated is plated by jetting a plating liquid from a nozzle, characterized by comprising a mask formed to correspond to the plating form of the object to be plated and to be in close contact with the object to be plated, a jacket tube in which the plating liquid jetting nozzle opposed to said mask is arranged, the mask and nozzle are enclosed and the above mentioned mask is brought into close contact with the object to be plated to form a sealed space, a discharging means which communicates with the jacket tube, holds the sealed space under a negative pressure and sucks and discharges the plating liquid, an electric power feeding means impressing voltages of predetermined polarities respectively to the object to be plated and nozzle and a means for utilizing an electric field migration by setting the distance between the electrodes to be about 0.1 to 2 mm.

4. A minute part plating apparatus according to claim 3, characterized in that the hole area B of the above mentioned nozzle and the through hole area b of the mask are so set as to establish the relation of $0.5 < B/b \leq 3$.

5. A minute part plating apparatus according to claim 3, characterized in that said discharging means is formed by using a suction pump.

6. A minute part plating apparatus according to claim 5, characterized in that said suction pump can control the negative pressure value in the above mentioned sealed space by adjusting the suction.

* * * * *